US009135382B1

(12) United States Patent
Lu et al.

(10) Patent No.: US 9,135,382 B1
(45) Date of Patent: Sep. 15, 2015

(54) SYSTEMS, METHODS, AND MEDIA FOR ASSERTION-BASED VERIFICATION OF DEVICES

(71) Applicants: Yuan Lu, San Jose, CA (US); Nitin Mhaske, Santa Clara, CA (US); Yunshan Zhu, Cupertino, CA (US)

(72) Inventors: Yuan Lu, San Jose, CA (US); Nitin Mhaske, Santa Clara, CA (US); Yunshan Zhu, Cupertino, CA (US)

(73) Assignee: Atrenta, Inc., San Jose, CA (US)

( * ) Notice: Subject to any disclaimer, the term of this patent is extended or adjusted under 35 U.S.C. 154(b) by 148 days.

(21) Appl. No.: 13/672,477

(22) Filed: Nov. 8, 2012

(51) Int. Cl.
G06F 17/50 (2006.01)

(52) U.S. Cl.
CPC .................. G06F 17/5022 (2013.01)

(58) Field of Classification Search
CPC ............ G06Q 20/401; G05D 23/2434; G05D 23/2723; G05D 23/1917; G06F 3/0487; G06F 17/5036
USPC .................................................. 716/100–108
See application file for complete search history.

(56) References Cited

U.S. PATENT DOCUMENTS

| 7,278,056 | B2 * | 10/2007 | Hekmatpour | 714/37 |
| 7,926,020 | B1 | 4/2011 | Lu et al. | |
| 8,326,778 | B1 | 12/2012 | Lu et al. | |
| 2003/0005396 | A1 * | 1/2003 | Chen et al. | 716/5 |
| 2003/0115562 | A1 | 6/2003 | Martin et al. | |
| 2005/0198597 | A1 | 9/2005 | Zhu et al. | |
| 2005/0229044 | A1 | 10/2005 | Ball | |
| 2006/0190857 | A1 * | 8/2006 | Likovich et al. | 716/4 |
| 2007/0074152 | A1 | 3/2007 | Roe | |
| 2008/0072196 | A1 * | 3/2008 | Hekmatpour et al. | 716/5 |
| 2008/0222580 | A1 * | 9/2008 | Banerjee et al. | 716/4 |
| 2008/0222581 | A1 * | 9/2008 | Banerjee et al. | 716/4 |
| 2010/0088257 | A1 | 4/2010 | Lu et al. | |

OTHER PUBLICATIONS

Katoen, "Concepts, Algorithms, and Tools for Model Checking", Lecture Notes of the Course "Mechanised Validation of Parallel Systems", Friedrich-Alexander Universitat Erlangen-Nurnberg, 1999, pp. 1-292.
Fraser, "Automated Software Testing with Model Checkers, Dissertation, Graz University of Technology", Oct. 2007, pp. 1-239.
"Sloan, et al., "On k-term DNF with the largest number of prime implicants", SIAM Journal on Discrete Mathematics, vol. 21 Issue 4, Jan. 2008, pp. 987-998."

* cited by examiner

*Primary Examiner* — Binh Tat
(74) *Attorney, Agent, or Firm* — Carr & Ferrell LLP

(57) ABSTRACT

Systems and methods for functionally verifying the performance of a system on a chip (SOC) are provided herein. According to some embodiments, the methods may include at least the steps of analyzing a verification log, via a functional verification system, to determine signatures by correlating a pattern of at least one of triggered and untriggered assertions in one or more blocks of a plurality of blocks to behaviors of at least one of the SOC and the one or more blocks of the plurality of blocks. Exemplary methods also include categorizing signatures according to the behaviors, and storing similar signatures based upon the categorization in a database.

23 Claims, 4 Drawing Sheets

SYSTEMS, METHODS, AND MEDIA FOR ASSERTION-BASED VERIFICATION OF DEVICES

BACKGROUND

Field of the Invention

The present invention relates generally to functional verification of devices and more particularly, but not by way of limitation, to systems, methods, and media for assertion-based verification of devices, such as a system-on-a-chip.

SUMMARY

According to some embodiments, the present invention may be directed to methods for functionally verifying the performance of a system on a chip (SOC) that includes a plurality of blocks. The methods may include: (a) analyzing a verification log including identifying signatures by correlating a pattern of at least one of triggered and untriggered assertions in one or more blocks of the plurality of blocks to behaviors of at least one of the SOC and the one or more blocks of the plurality of blocks; (b) categorizing the signatures according to the behaviors of at least one of the SOC and one or more blocks of the plurality of blocks; and (c) storing the signatures based upon the categorization in a database.

According to other embodiments, the present invention may be directed to functional verification systems. The systems may include: (a) a processor, and (b) a memory coupled to the processor, the memory configured to store a program, the program being executable by the processor to perform a method, the method comprising: (i) analyzing a verification log including identifying signatures by correlating a pattern of at least one of triggered and untriggered assertions in one or more blocks of the plurality of blocks to behaviors of at least one of the SOC and one or more blocks of the plurality of blocks; and (ii) categorizing the signatures according to the behaviors of at least one of the SOC and one or more blocks of the plurality of blocks and stores the signatures based upon the categorization in a database communicatively couplable with the functional verification system.

According to additional embodiments, the present invention may be directed to non-transitory computer readable storage media having embodied thereon a program, the program being executable by a processor to perform a method for methods for functionally verifying the performance of a system on a chip (SOC) that includes a plurality of blocks. The methods may include: (a) analyzing a verification log including identifying signatures by correlating a pattern of at least one of triggered and untriggered assertions in one or more blocks of the plurality of blocks to behaviors of at least one of the SOC and the one or more blocks of the plurality of blocks; (b) categorizing the signatures according to the behaviors of at least one of the SOC and one or more blocks of the plurality of blocks; and (c) storing the signatures based upon the categorization, in a database.

BRIEF DESCRIPTION OF THE DRAWINGS

Certain embodiments of the present technology are illustrated by the accompanying figures. It will be understood that the figures are not necessarily to scale and that details not necessary for an understanding of the technology or that render other details difficult to perceive may be omitted. It will be understood that the technology is not necessarily limited to the particular embodiments illustrated herein.

DESCRIPTION OF EXEMPLARY EMBODIMENTS

Figure 1:
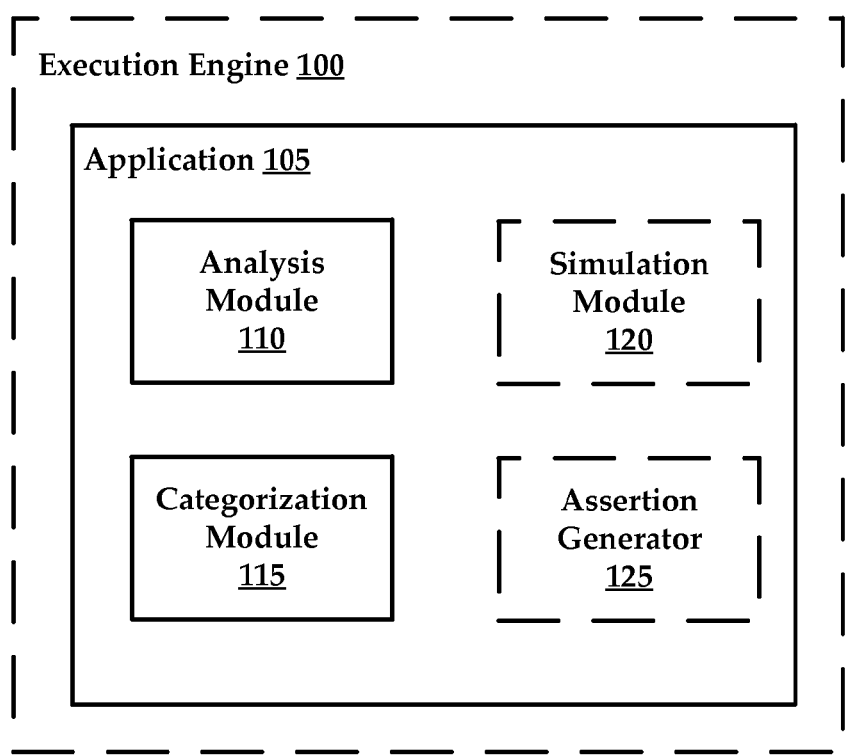
FIG. 1 is a diagram of an exemplary execution engine having a function verification application, constructed in accordance with the present disclosure.

While this technology is susceptible of embodiment in many different forms, there is shown in the drawings and will herein be described in detail several specific embodiments with the understanding that the present disclosure is to be considered as an exemplification of the principles of the technology and is not intended to limit the technology to the embodiments illustrated.

It will be understood that like or analogous elements and/or components, referred to herein, may be identified throughout the drawings with like reference characters. It will be further understood that several of the figures are merely schematic representations of the present technology. As such, some of the components may have been distorted from their actual scale for pictorial clarity.

Generally speaking, the present technology is concerned with function verification of an entire (or parts of) a complex digital system, such as an integrated circuit (IC). Complex digital systems may, for example, include a System On a Chip (SOC). Functional verification (or simulation) may, for example, assume that all the elements in a circuit possess an identical delay (e.g., unit delay) and may not evaluate specific individual (e.g., logic and net) delays. The present technology may, for example, utilize assertions in simulation and/or emulation environments. For the purpose of clarity, both the complex digital system (e.g., SOC) and blocks thereof may hereinafter be referred to as a "device" unless descriptive context requires labeling otherwise.

An SOC may be generally described as an integrated circuit that includes a plurality of blocks (also known an intellectual property or IP). SOC blocks may, for example, include: digital, analog, mixed-signal, and radio-frequency functions. Examples of SOCs include: a central processing unit (CPU), graphics processing unit (GPU), application or baseband processor, and the like. Each of the blocks of an SOC may provide a unique functionality. Exemplary blocks may include microprocessors, memory, peripherals, timers, communications interfaces, and data converters, just to name a few. The blocks of an SOC may interact with one another via one or more buses that communicatively couple one or more blocks.

The SOC and the SOC block(s) may be represented, for example, by register-transfer-level (RTL) code. Hardware description languages (HDL), such as VHSIC hardware description language (VHDL, IEEE 1076), Verilog (IEEE 1364), and the like, may be used to specify and model the SOC and the SOC block(s). One or more hardware verification languages (HVL), such as e (IEEE 1647), property specification language (PSL, IEEE 1850), and the like, may further be used to verify the device. Languages combining features of HDLs and HVLs, such as SystemVerilog (IEEE 1800), SystemC (IEEE 1666), and the like, may also be used.

Each of the blocks and the SOC itself may be provided with assertions. Assertions may specify design behaviors (e.g., properties) and scenarios (e.g., coverage points) to be modeled. A property may be a statement about a specific behavior of a design and may include functionality, timing, or any other aspect of the design. For example, assertions may document design intent for the inputs and outputs of a block, as well as for the block's internal behavior. An assertion may include a predicate that defines a property (e.g., intended behavior) of a block or an SOC. Stated differently, an assertion may provide a monitor that ensures a property holds once, always holds, or never holds during verification of the design.

An assertion acts as a functional switch that can be triggered when stimuli are applied to the block or the SOC. The triggering of the assertion may indicate that the block or SOC has exhibited behavior outside expected specifications or operating parameters established by the block or SOC designer. For example, an exemplary block may implement a FIFO. Using an assertion-based verification (ABV) methodology, the designer would define assertions that capture the design intent (in this case, that neither overflow nor underflow of the FIFO may occur). Assertions may be included within the source code of (e.g., RTL code for) the SOC and/or block, a simulation file (e.g., testbench), a separate file (e.g., constraints file), and the like. In short, assertions may provide mechanisms for determining differences between the intended behavior and the simulated behavior of a device.

While descriptions above illustrate that assertions may be utilized to functionally verify the behavior of a block, assertions may likewise be generated and utilized to functionally verify the operation of the SOC. For example, assertions may be created to test the actual operation of the SOC to determine errors such as resource conflicts (e.g., multiple blocks accessing a bus simultaneously).

A device may be tested through device simulation, formal verification, or emulation, or any other testing means to verify that a particular function is correctly implemented. Testing includes applying a plurality of verification cycles (usually millions) to the device. The application of a verification cycle may include applying a stimulus to the device, determining the device's response, and storing the verification information (e.g., the output) of the device in a simulation log. Each verification cycle may include a different stimulus that approximates the broad range of typical stimuli that the device may be expected to experience in actual use. Verification information of a verification cycle may be categorized as a pass or a failure.

The verification information of the verification cycle may be stored in a verification log and may include a time stamp. With regard to SOCs specifically, assertions that are triggered during a verification cycle for each block and the SOC may also be recorded. Because many (again, possibly millions of) verification cycles may be applied to a device, time stamping allows designers to narrow down the stimulus that may have caused a failure or triggered an assertion by correlating stimuli with the triggered assertion based on time stamps. For example, stimuli temporally preceding and following an triggered assertion may be analyzed as potential root causes of a failure.

According to some embodiments, assertions may include both assertive assertions and coverage assertions. The triggering of an assertive assertion is generally interpreted as a negative performance of the device occurring in response to application of a stimulus or stimuli to the device (either in physical embodiment or emulation of the device). The triggering of a coverage assertion is generally interpreted as a positive performance of the device occurring in response to application of a stimulus or stimuli to the device (either in physical embodiment or emulation of the device).

As would be appreciated by one of ordinary skill in the art, the more assertions (both assertive assertions and coverage assertions) that can be generated and the more verification cycles that can be applied to the SOC and its constituent blocks, the more certain device designers may be about the actual real-world behavior of the device. Unfortunately, assertions are often created manually by the device designer. This results in an insufficient number of assertions being generated.

Assertions may automatically be generated for devices using previously produced verification logs for similar devices (e.g., SOCs incorporating a similar block or blocks). Verification logs may be analyzed for failed verification cycles and create assertions that may be used to identify potential flaws in the design in question and/or other SOCs incorporating one or more similar blocks. The sufficiency of assertions (e.g., amount of assertions necessary) and verification cycles may also be addressed. For example, after functionally verifying a plurality of devices, it may be determined that, for particular types of devices (e.g., SOCs having similar blocks), that the devices never trigger one or more assertions. In this case, these assertions may be selectively omitted in future verification cycles or modified until the assertion is triggered.

With regard to the amount of assertions created for each device, the desired functions of the device and potential operating parameters (expected real-world stimuli) may be evaluated, and an optimal number of assertions may be generated for the device. For example, if a microprocessor can perform several thousand different instructions/operations, the present technology may automatically generate an assertion for each instruction/operation, or a subset of the instructions/operations. In sum, the more assertions that can be executed for a device in simulation or emulation, the more likely the complex digital system will operate according to its design specification.

To aid in analysis of verification logs, the present technology may categorize failure verification information by generating signatures for each verification cycle and grouping verification cycles together via the signatures. Specifically for an SOC device, a signature may include an aggregate number of triggered (and/or untriggered) assertions for each block. The grouping of verification cycles according to signature may assist designers in determining a root cause trigger when multiple assertions fail.

These and other advantages are described in greater detail below, with reference to the above-identified drawings.

FIG. 1. illustrates an exemplary execution engine 100 for practicing aspects of the present technology. The execution engine 100 may include many of the components of the computing system 400, described in greater detail with regard to FIG. 4. Additionally, the execution engine 100 may comprise a functional verification application, hereinafter "application 105" that is utilized to functionally verify devices such as a system-on-a-chip, hereinafter (SOC). The execution engine 100 may comprise any of a physical and/or a virtualized device that executes instructions that functionally verify the performance of devices. Non-limiting examples of the execution engine 100 include a logic simulator, an emulator, an intelligent verifier, a formal verification engine, and/or combinations thereof.

According to some embodiments, the application 105 may include an analysis module 110, a categorization module 115, and optional modules such as a simulation module 120, and an assertion generator 125. It is noteworthy that the application 105 may include additional or fewer modules, engines, or components. As used herein, the term "module" may also refer to any of an application-specific integrated circuit (ASIC), application-specific standard product (ASSP), field programmable gate array (FPGA), an electronic circuit, a processor or processors (shared, dedicated, or group) that execute one or more software or firmware programs, sequential and/or combinational logic circuit(s), and/or other suitable components that provide the described functionality.

Initially, it is noteworthy to mention that the application 105 may receive a verification log for a device from another execution engine. In other embodiments, the application 105 may generate the verification log, as will be discussed in greater detail infra. Upon receiving a verification log the analysis module 110 may be executed to analyze the verification log. The analysis module 110 may utilize the verification log to generate a signature for each of a plurality of behaviors (e.g., failures) included in the verification log. A signature may, for example, be a pattern of triggered assertions in one or more blocks correlated to a particular behavior in a block (e.g., failure). In some embodiments, a signature includes a sequence associated with and number of triggered assertions. Behaviors (e.g., failures) may manifest as an emulated or simulated event, such as a stuck pixel, dropped wireless call, exception/interrupt, and the like, depending upon the SOC being verified. A verification log often contains the verification information from a plurality (sometimes millions) of individual verification cycles. According to some embodiments, each verification information includes an indication of whether the verification cycle resulted in one or more passes or fails. Additionally, the verification information may include an aggregate number of triggered (and/or untriggered) assertions for each of the plurality of blocks and the SOC. These events may also be time stamped to provide temporal data. Again, triggered (and/or untriggered) assertions may be determined for both the SOC and its constituent blocks.

Once signatures have been created using the verification log, the categorization module 115 may be executed to categorize each of the behaviors (e.g., failures) according to similar signatures. That is, each signature created from the verification log may be compared against signatures from other devices, such as additional SOCs. In other embodiments, the signatures of a device may be compared to previous signatures generated for the same device, after the device has been modified or reconfigured. In this way, functional behaviors of the device resulting from modifications may be expressed as a comparative value relative to before and after signatures. These types of analyses may be utilized in a root case determination analysis, to fine tune functional verification processes, and/or automatically generate assertions for future functional verification processes.

The categorization module 115 may group similar signatures together based upon the categorization and store these groups in a database, thereby providing a basis for comparing verification logs of similar devices.

One of ordinary skill in the art with the present disclosure before them will readily appreciate that the signature generation processes described above may also be applied at the block level to generate signatures indicative of the performance of a given block. Additionally, it is noteworthy to mention that independent verification of the blocks of an SOC before functional verification of the whole SOC may substantially reduce noisy verification log data for the SOC. That is, prior functional verification of each block may reduce failure events attributable only to a block. Such failures may result in excessive triggered (and/or untriggered) assertion data in verification logs generated for the SOC. In sum, functionally verifying blocks independently from and prior to functional verification of the SOC improves the likelihood that verification information included in the verification log file of the SOC includes a substantial amount of functional data that is attributable to the SOC.

In some embodiments, the analysis module 110 and the categorization module 115 may be utilized to specifically process verification cycles that resulted in a failure verification information. These failed verification cycles may be analyzed, categorized, and flagged for further review.

In additional embodiments, the analysis module 110 not only generates a signature that includes aggregate number of triggered (and/or untriggered) assertions for each block of an SOC, but the analysis module 110 may obtain and analyze a predetermined number of verification cycles occurring before and after a particular verification cycle. This is due to the fact that verification cycles are time stamped during the verification log creation process. For example, the analysis module 110 may analyze ten thousand cycles prior to and subsequent to a verification cycle that resulted in a failure verification information.

By way of non-limiting examples, assuming an SOC is subjected to one thousand verification cycles. Nine hundred verification cycles resulted as passing and one hundred resulted as failing. The analysis module 110 may be utilized to evaluate the one hundred failed verification cycles to determine a root cause for the failure. The analysis module 110 may generate a signature for each failed verification cycle, where the signature includes an aggregate number of triggered (and/or untriggered) assertions for each block of the SOC, along with an aggregate number of triggers for the SOC itself.

The categorization module may group similar signatures together. It will be understood that similar signatures may include identical blocks of separate SOCs having the same number of triggered (and/or untriggered) assertions relative to one another. That is, the similarity of signatures can be a flexible variable that depends upon design criteria. The greater the similarity between signatures, the greater likelihood that the failure events for the signatures were generated by the same root cause.

Similarly, differences between passing verification cycles for an SOC may be compared against failed verification cycles. For example, when a particular block of an SOC is analyzed, it is observed that five triggered assertions are present in each passing verification cycle. In contrast, a failed verification cycle, when compared to the passing verification cycles by the analysis module 110 shows that a new triggered assertion is present. Therefore, it can be inferred that the source of the failure may be determined by examining only the differentiating assertion. Such comparative types of analysis substantially reduce the amount of review that much be conducted as compared to a traditional root cause analysis.

According to some embodiments, the application 105 may employ a simulation module 120 that applies stimuli (e.g., testbench) to a device (either in a physical or virtual manner) and records the verification information in a verification log. As stated previously, the application of a stimulus to the device is known as a verification cycle. Variations in stimuli applied to the device allow for functional verification of design parameters of the device. That is, the device may be tested with a wide array of varying stimuli to determine if the device operates to the design specification of the device. The design specification of the device may include detailed description of architecture, resources, functions, instructions, operations, cycles, timing, and the like.

More specifically, the simulation module 120 may expose an SOC to a predetermined amount of assertions to functionally verify the performance of the SOC. The amount of assertions that the simulation module 120 applies to the SOC may be based upon the amount of functions that the SOC is expected to perform. Utilizing the comparison of signatures obtained by the analysis module 110, the simulation module 120 may determine that previous SOCs that were functionally verified and met a design specification (i.e., generated passing results) utilized, for example, at least ten thousand assertions for each block of the SOC and at least fifty thousand assertions for the SOC itself.

Utilizing such information, the assertion generator 125 may be executed to automatically generate assertions for each of the blocks and/or the SOC. As noted above, the assertions generated by the assertion generator 125 may be based upon empirical data gathered from the verification of logs of similar SOCs, along with design requirements (i.e., design specification) for the SOC itself.

According to some embodiments, the assertion generator may automatically generate assertions by obtaining previously generated verification logs for SOCs having one or more blocks that are substantially similar to the plurality of blocks included in the SOC that is to be verified.

In other embodiments, the number of assertions generated for each of the plurality of blocks and the SOC is based upon a number of functions or operations that are to be performed by each block and the SOC during simulation, emulation, and/or actual operation. Returning to a previous example, if a microprocessor is expected to perform several thousand different instructions/operations, the assertion generator 125 may automatically generate an assertion for each instruction/operation, or a subset of the instructions/operations. In sum, the more assertions that can be evaluated for a device during verification, the more likely the device will operate according to its design specification. Advantageously, failures can be quickly identified and remedied.

Figure 2:
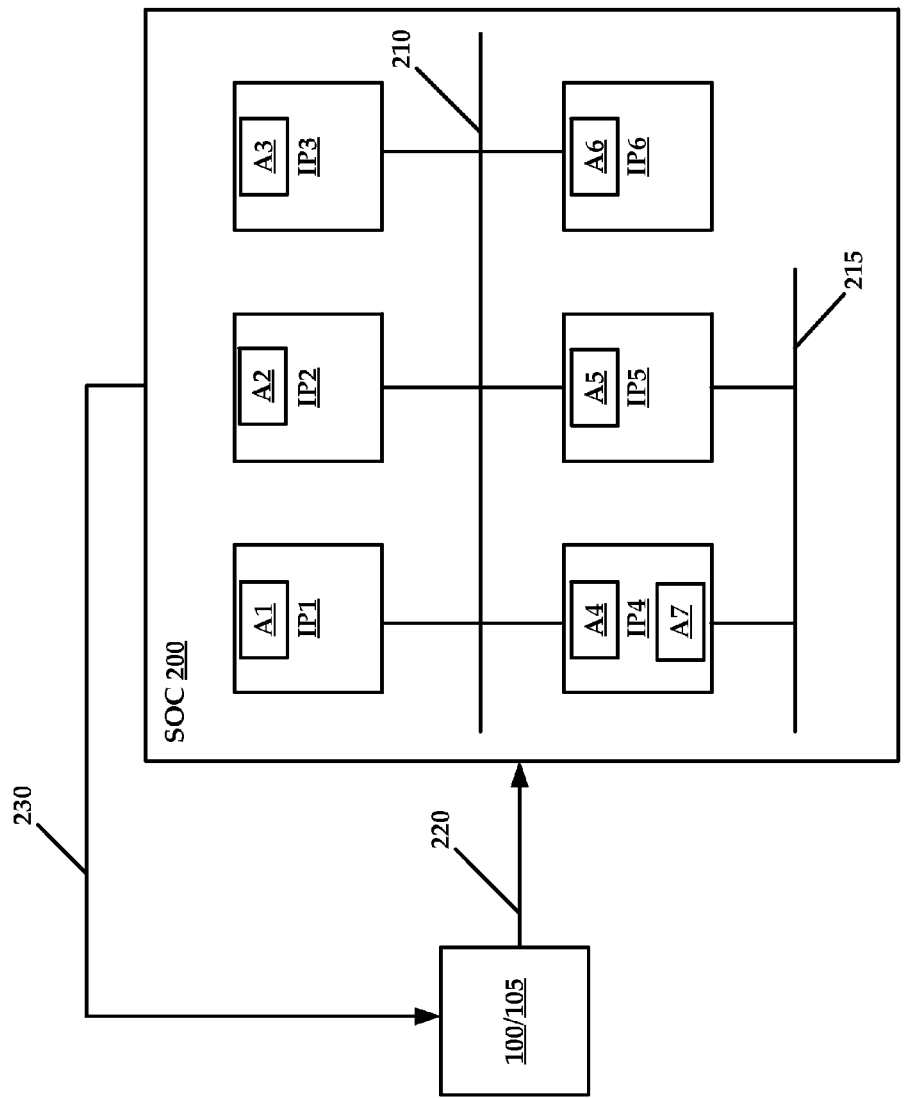
FIG. 2 illustrates an exemplary system-on-a-chip having a plurality of blocks that each include assertions, and also assertions for the SOC itself.

FIG. 2 illustrates an exemplary SOC 200 that may be analyzed by the functional verification application 105 executing on the execution engine 100 described above. The SOC 200 is shown as generally including a plurality of blocks, shown as block IP1 through block IP6. It will be understood that the SOC 200 may include any number of blocks IP1-*n*. The blocks IP1-6 are shown as being communicatively (and electrically) coupled via a primary bus 210, while blocks may also communicatively couple with a secondary bus 215. The SOC 200 may include any number of buses that communicatively couple two or more blocks together.

Each of the blocks includes assertions A1 through A6 that are encoded onto the block. Additionally, the SOC 200 includes assertions A7 that may be stored in the memory of the SOC 200 (which itself may be a block, shown herein as block IP4 for illustrative purposes only).

Stimuli 220 are communicated to the SOC 200 via the execution engine 100 and verification information 230 are received by the execution engine 100. The stimuli may be generated and communicated by the application 105 and verification information may also be received by the application 105. For example, the execution engine 100 may generate and communicate stimuli 220 to the SOC 200, but the application (105 in FIG. 1) may obtain verification information directly from the SOC 200, or may obtain a verification log from the execution engine 100.

Figure 3:
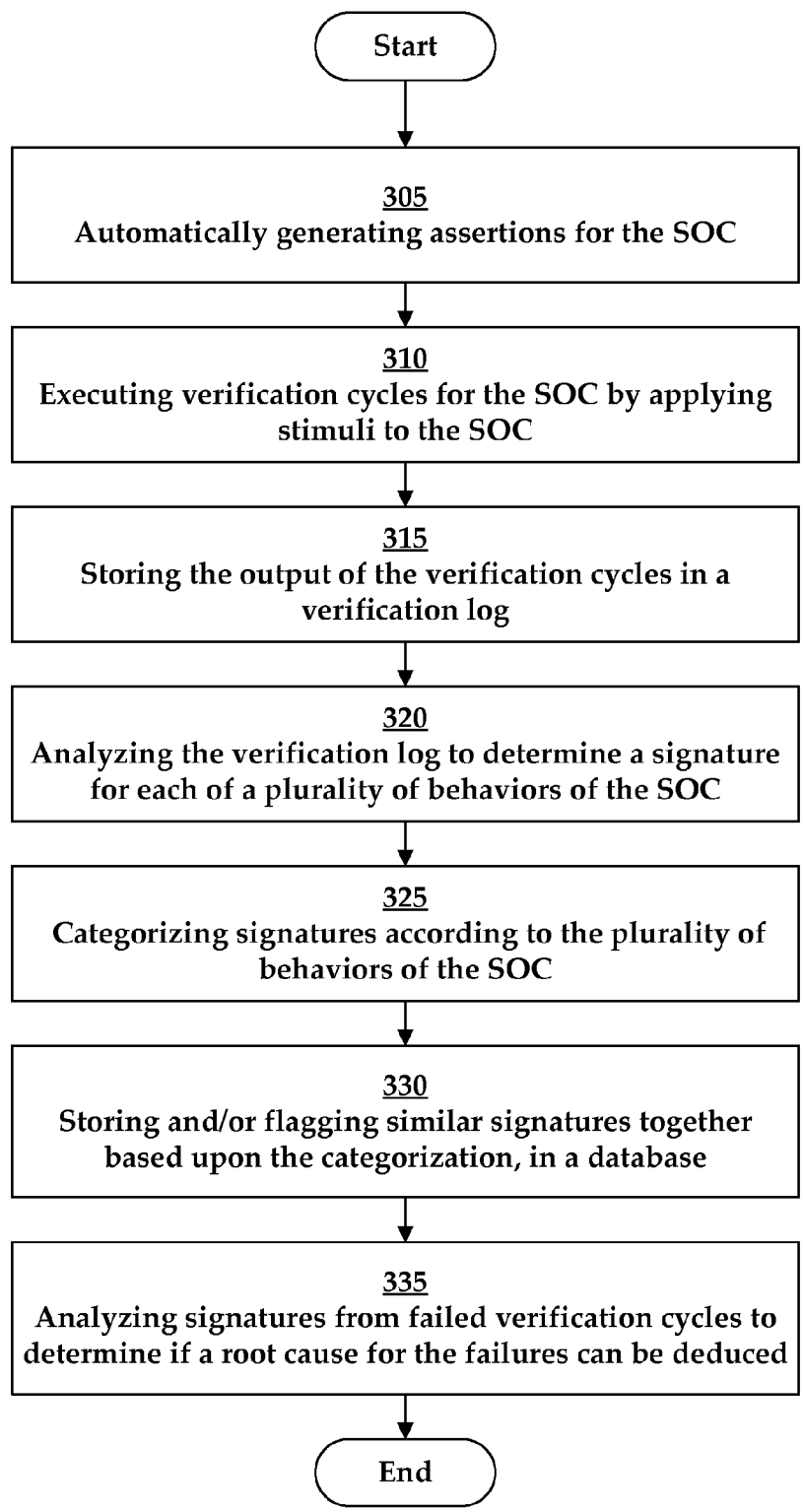
FIG. 3 illustrates a flowchart of an exemplary method for functionally verifying the performance of a system-on-a-chip.

FIG. 3 illustrates a flowchart of an exemplary method for functionally verifying the performance of a system on a chip (SOC) that includes a plurality of blocks. Initially, the method may include a step 305 of automatically generating assertions for the SOC. It will be understood that each of the assertions may include a predicate corresponding to a property (e.g. intended behavior) of the SOC.

These assertions may be generated from previous SOC verification logs. Additionally, the number of assertions generated may depend upon the desired number of verification cycles to be executed on the SOC, as well as the number of operations the SOC is expected to perform during verification.

The method may include a step 310 of executing verification cycles for the SOC by applying stimuli to the SOC, determining a response or responses to the stimuli, and generating verification information. The method may include a step 315 of storing the verification information of the verification cycles in a verification log. It is noteworthy to mention that the each verification cycle may include verification information such as behavior (e.g., pass or fail) and a number of triggered (and/or untriggered) assertions for each of the plurality of blocks of the SOC, along with associated temporal data (e.g., timestamp).

After generation of the verification log, the method may include a step 320 analyzing the verification log to determine a signature for each of a plurality of behaviors (e.g., failures).

The method may include a step 325 of categorizing behaviors (e.g., failures) according to similar signatures, and also a step 330 of storing and/or flagging similar signatures together based upon the categorization, in a database.

In particular, failed verification cycles may be categorized by signatures and flagged for further review. In some embodiments, the method may include a step 335 of analyzing similar signatures from failed verification cycles to determine if a root cause for the failures can be determined. It will be understood that in some embodiments, the method may include additional or fewer steps from those recited herein.

Figure 4:
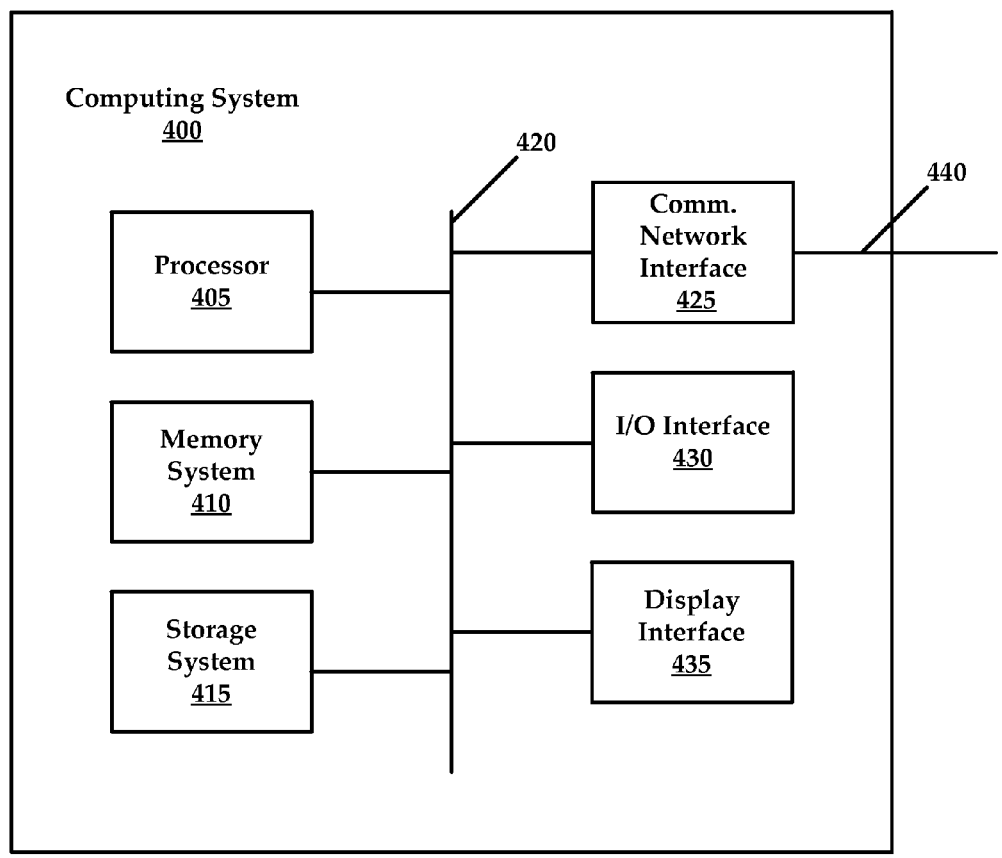
FIG. 4 illustrates an exemplary computing system that may be used to implement embodiments according to the present technology.

FIG. 4 illustrates an exemplary computing system 400. The computing system 400 comprises at least a processor 405, a memory system 410, and a storage system 415, which are all coupled to a bus 420. The computing system 400 may also comprise a communication network interface 425, an input/output (I/O) interface 430, and a display interface 435. The communication network interface 425 may couple with a communication network such as the Internet (not shown) via a communication medium 440, such as an Ethernet connection. The bus 420 provides communications between the communications network interface 425, the processor 405, the memory system 410, the storage system 415, the I/O interface 430, and the display interface 435.

The communications network interface 425 may communicate with other digital devices (not shown) via the communications medium 440. The processor 405 executes instructions. The memory system 410 permanently and/or temporarily stores instructions and data. Some examples of the memory system 410 are RAM and ROM. The storage system 415 also permanently and/or temporarily stores data. Some examples of the storage system 415 are hard disks and disk drives. The I/O interface 430 may include any device that can receive input and provide output to a user. The I/O interface 430 may include, but is not limited to, a keyboard, a mouse, a touchscreen, a keypad, a biosensor, a compact disc (CD) drive, a digital versatile disc (DVD) drive, blu-ray disc (BD) drive, USB flash drive, a floppy disk drive, and the like. The display interface 435 may include an interface configured to support a display, monitor, screen, and the like. In some embodiments, the computing system 400 comprises a graphical user interface to be displayed to a user over a monitor in order to allow the user to control the computing system 400.

The embodiments discussed herein are illustrative. As these embodiments are described with reference to illustrations, various modifications or adaptations of the methods and/or specific structures described may become apparent to those skilled in the art.

The above-described modules may be comprised of instructions that are stored on storage media (e.g., computer readable media). The instructions may be retrieved and executed by a processor (e.g., the processor 405). Some examples of instructions include software, program code, and firmware. Some examples of storage media comprise memory devices and integrated circuits. The instructions are operational when executed by the processor to direct the processor to operate in accordance with embodiments of the present invention. Those skilled in the art are familiar with instructions, processor(s), and storage media.

In the foregoing specification, the invention is described with reference to specific embodiments thereof, but those skilled in the art will recognize that the invention is not limited thereto. Various features and aspects of the above-described invention can be used individually or jointly. Further, the invention can be utilized in any number of environments and applications beyond those described herein without departing from the broader spirit and scope of the specification. The specification and drawings are, accordingly, to be regarded as illustrative rather than restrictive. It will be recognized that the terms "comprising," "including," and "having," as used herein, are specifically intended to be read as open-ended terms of art.

What is claimed is:

1. A method for functionally verifying the performance of a system on a chip (SOC) that includes a plurality of blocks, the method comprising:
   generating a verification log, including:
      automatically generating assertions for each of a plurality of blocks, each of the assertions including a predicate for a property of a block;
      executing verification cycles for each of the plurality of blocks including applying one or more stimuli to a block to generate verification information; and
      storing the verification information for each verification cycle in the verification log, the verification log including temporal data associated with each verification cycle;
   analyzing, by a processor coupled to a memory, the verification log, including identifying signatures by correlating a pattern of at least one of triggered and untriggered assertions in one or more blocks of the plurality of blocks to behaviors of at least one of the SOC and the one or more blocks of the plurality of blocks;
   categorizing, by the processor, the signatures according to the behaviors of the at least one of the SOC and the one or more blocks of the plurality of blocks; and
   storing, by the processor, the signatures based upon the categorization in a database.

2. The method of claim 1, further comprising:
   automatically generating, by the processor, assertions for the SOC, each of the assertions including a predicate corresponding to a property of the SOC;
   performing, by the processor, verification cycles for the SOC simulation by applying one or more stimuli to the SOC and determining one or more responses of the SOC to generate further verification information; and
   storing, by the processor, the further verification information for each verification cycle in a verification log, the verification log including temporal data associated with each verification cycle.

3. The method of claim 1, further comprising:
   evaluating, by the processor, the verification log for failed verification cycles;
   analyzing, by the processor, triggered assertions included in each failed verification cycle, wherein each of the triggered assertions is a violation of a predicate of an assertion;
   generating, by the processor, at least one signature for each failed verification cycle; and
   flagging, by the processor, the at least one signature for review.

4. The method of claim 1, wherein automatically generating assertions includes obtaining previously generated verification logs for SOC simulations having one or more blocks that are substantially similar to the plurality of blocks included in the SOC.

5. The method of claim 1, wherein automatically generating assertions includes generating a predetermined number of assertions for each of the plurality of blocks and the SOC, wherein the predetermined number of assertions is based upon a number of features included in each of the plurality of blocks and the SOC.

6. The method of claim 5, wherein the verification log includes a predetermined amount of verification cycles, wherein the predetermined amount of verification cycles are based upon the predetermined number of assertions for each of the plurality of blocks and the SOC.

7. The method of claim 1, further comprising:
   comparing, by the processor, the signatures of a first SOC simulation to signatures of one or more additional SOC simulations;
   selecting, by the processor, at least one additional SOC simulation based upon the comparing;
   further comparing, by the processor, signatures of at least one block of the first SOC to signatures of at least one block of the at least one additional SOC simulation; and
   flagging, by the processor, dissimilar signatures for review.

8. The method of claim 7, wherein comparing includes comparing a number of signatures of each block of the first SOC simulation to a number of signatures of each of the plurality of blocks of the one or more additional SOC simulations.

9. The method according to claim 8, further comprising:
   comparing, by the processor, the number of signatures of the SOC simulation to a number of signatures for the at least one additional SOC simulation;
   identifying, by the processor, dissimilar signatures; and
   providing, by the processor, the dissimilar signatures for review.

10. The method according to claim 1, further comprising:
    determining, by the processor, a failure result, analyzing a predetermined number of verification cycles occurring at least one of before and after the failure result and flagging the predetermined number of verification cycles for review.

11. The method according to claim 1, further comprising executing the method by at least one of logical simulation, emulation, and functional verification.

12. The method according to claim 1, further comprising collecting similar verification cycles based upon their signatures and storing the same in a database.

13. A functional verification system, comprising:
    a processor; and a memory coupled to the processor, the memory configured to store a program, the program being executable by the processor to perform a method, the method comprising:

generating a verification log, including:

automatically generating assertions for each of a plurality of blocks, each of the assertions including a predicate for a property of a block;

executing verification cycles for each of the plurality of blocks including applying one or more stimuli to a block to generate verification information; and storing verification information for each verification cycle in the verification log, the verification log including temporal data associated with each verification cycle;

analyzing the verification log, including identifying signatures by correlating a pattern of at least one of triggered and untriggered assertions in one or more blocks of the plurality of blocks to behaviors of at least one of the SOC and the one or more blocks of the plurality of blocks;

categorizing the signatures according to the behaviors of the at least one of the SOC and the one or more blocks of the plurality of blocks; and storing the signatures based upon the categorization in a database communicatively couplable with the functional verification system.

14. The system of claim 13 wherein the method further comprises:

automatically generating assertions for the SOC, each of the assertions including a predicate corresponding to a property of the SOC;

executing verification cycles for the SOC including applying one or more stimuli to the SOC;

generating a signature for one or more behaviors for the SOC by determining a number of triggered assertions for each of the plurality of blocks of the SOC; and storing verification information for each verification cycle in a verification log, the verification log including temporal data relative to each verification cycle.

15. The system of claim 13 wherein the method further comprises:

evaluating the verification log for failed verification cycles;

analyzing triggered assertions included in each failed verification cycle, wherein each of the triggered assertions is a violation of a predicate of an assertion;

generating at least one signature for each failed verification cycle; and flagging the at least one signature for review.

16. The system of claim 13 wherein the method further comprises:

automatically generating assertions by obtaining previously generated verification logs for SOCs having one or more blocks that are substantially similar to the plurality of blocks included in the SOC.

17. The system of claim 13, wherein the method further comprises:

generating a predetermined number of assertions for each of the plurality of blocks and the SOC, wherein the predetermined number of assertions is based upon a number of properties required for each block and the SOC.

18. The system of claim 13, wherein the method further comprises:

comparing the signature of a first SOC to signatures of one or more additional SOCs;

selecting at least one additional SOC based upon the comparing;

comparing assertion triggers of at least one block of the first SOC to assertion triggers of at least one block of the at least one additional SOC; and flagging dissimilar assertion triggers for review.

19. The system of claim 18, wherein the method further comprises:

comparing a number of triggered assertions for each block of the first SOC to a number of triggered assertions for each of the blocks of the one or more additional SOCs.

20. The system of claim 19, wherein the method further comprises:

comparing the number of triggered assertions for the SOC to a number of triggered assertions for at least one additional SOC;

identifying dissimilar triggered assertions; and flagging the dissimilar triggered assertions for review.

21. The system of claim 13, wherein upon determining a failure result, the analysis module further analyzes a predetermined amount of verification cycles, wherein the predetermined amount of verification cycles are based upon the predetermined number of assertions for each of the plurality of blocks and the SOC.

22. The system of claim 13, wherein the functional verification application is integrated within an execution engine, the execution engine including at least one of a hardware simulation system, an emulation system, and a functional verification system.

23. A non-transitory computer readable storage medium having embodied thereon a program, the program being executable by a processor to perform a method for functionally verifying the performance of a system on a chip (SOC) that includes a plurality of blocks, the method comprising:

generating a verification log, including:

automatically generating assertions for each of a plurality of blocks, each of the assertions including a predicate for a property of a block;

executing verification cycles for each of the plurality of blocks including applying one or more stimuli to a block to generate verification information; and storing verification information for each verification cycle in the verification log, the verification log including temporal data associated with each verification cycle;

analyzing the verification log to including identifying signatures by correlating a pattern of at least one of triggered and untriggered assertions in one or more blocks of the plurality of blocks to behaviors of at least one of the SOC and the one or more blocks of the plurality of blocks;

categorizing the signatures according to the behaviors of the at least one of the SOC and the one or more blocks of the plurality of blocks; and storing the signatures based upon the categorization in a database.

* * * * *